(12) United States Patent
Han et al.

(10) Patent No.: US 8,269,413 B2
(45) Date of Patent: Sep. 18, 2012

(54) ORGANIC LIGHT EMITTING DISPLAY DEVICE WITH SPACER ON NON-LIGHT EMISSION REGION AND MANUFACTURING METHOD OF THE SAME

(75) Inventors: Dong-won Han, Suwon-si (KR); Hyo-jin Kim, Suwon-si (KR)

(73) Assignee: Samsung Mobile Display Co., Ltd., Giheung-Gu, Yongin, Gyunggi-Do (KR)

(*) Notice: Subject to any disclaimer, the term of this patent is extended or adjusted under 35 U.S.C. 154(b) by 396 days.

(21) Appl. No.: 12/078,568

(22) Filed: Apr. 1, 2008

(65) Prior Publication Data
US 2009/0009055 A1   Jan. 8, 2009

(30) Foreign Application Priority Data
Jul. 4, 2007  (KR) .................. 10-2007-0066882

(51) Int. Cl.
*H01J 1/62* (2006.01)
*H01J 63/04* (2006.01)

(52) U.S. Cl. ........ 313/504; 313/498; 313/506; 313/292; 445/24; 445/25

(58) Field of Classification Search .......... 313/498–512, 313/292; 445/24–25
See application file for complete search history.

(56) References Cited

U.S. PATENT DOCUMENTS

| 6,114,806 A | 9/2000 | Itoh | |
|---|---|---|---|
| 2006/0145596 A1* | 7/2006 | Coe | 313/500 |
| 2006/0192487 A1* | 8/2006 | Choi et al. | 313/512 |
| 2007/0108899 A1* | 5/2007 | Jung et al. | 313/506 |
| 2008/0036367 A1* | 2/2008 | Eida et al. | 313/504 |
| 2008/0150419 A1* | 6/2008 | Kang | 313/504 |

FOREIGN PATENT DOCUMENTS

| JP | 2002-231441 | 8/2002 |
|---|---|---|
| JP | 2002-350870 | 12/2002 |
| KR | 1997-0017812 | 4/1997 |
| KR | 10-2006-0104528 A | 10/2006 |

OTHER PUBLICATIONS

Notice of Allowance issued by the KIPO on Dec. 3, 2008 in Applicant's corresponding Korean Application No. 10-2007-0066882.

Office Action from the KIPO issued in Applicant's corresponding Korean Patent Application No. 2007-0066882 dated Mar. 29, 2008.

* cited by examiner

*Primary Examiner* — Anh Mai
*Assistant Examiner* — Kevin Quarterman
(74) *Attorney, Agent, or Firm* — Robert E. Bushnell, Esq.

(57) ABSTRACT

An organic light emitting display device having spacers and a manufacturing method thereof. The organic light emitting display device according to the present invention includes a first substrate divided into a pixel region and a non-pixel region surrounding the pixel region; a plurality of organic light emitting diodes having each pixel formed on the first substrate and provided onto the pixel region; a second substrate for encapsulating the pixel region; and a spacer arranged between the first substrate and the second substrate, provided in at least on region between pixels as a non-light emission region and containing a desiccant.

14 Claims, 5 Drawing Sheets

ORGANIC LIGHT EMITTING DISPLAY DEVICE WITH SPACER ON NON-LIGHT EMISSION REGION AND MANUFACTURING METHOD OF THE SAME

CLAIM OF PRIORITY

This application makes reference to, incorporates the same herein, and claims all benefits accruing under 35 U.S.C. §119 from an application for ORGANIC LIGHT EMITTING DISPLAY DEVICE AND MANUFACTURING METHOD OF THE SAME earlier filed in the Korean Intellectual Property Office on 4 Jul. 2007 and there duly assigned Serial No. 10-2007-0066882.

BACKGROUND OF THE INVENTION

1. Field of the Invention

The present invention relates to an organic light emitting display device, and a manufacturing method of the same, and more particularly to an organic light emitting display device having a spacer arranged between a first substrate and a second substrate, and a manufacturing method of the same.

2. Description of the Related Art

In general, an organic light emitting display device is a self-emissive display that a fluorescent organic compound is electrically excited to generate lights. The organic light emitting display device has advantages that it may be driven by a voltage and easily manufactured with a smaller size and thinner thickness, and has physical properties such as a viewing angle, a short response time, etc., and therefore the organic light emitting display device has come into the spotlight as a next-generation display device.

A conventional organic light emitting display device includes a deposition substrate; at least one organic light emitting diode deposited on a first substrate; an encapsulation substrate bonded to the deposition substrate to encapsulate the organic light emitting diode; and a sealing member for bonding the encapsulation substrate to the deposition substrate.

In the conventional organic light emitting display device, the encapsulation substrate is provided to prevent the organic light emitting diodes from reacting with oxygen and moisture from the outside environment, and prevent organic matters from being damaged due to the reaction of the organic matters with oxygen and moisture, the organic matters constituting a light emission layer of the organic light emitting diode.

The organic light emitting display device, however, has problems that the encapsulation substrate may be in contact with organic light emitting diodes, or the encapsulation substrate be damaged by the external impacts because the distance between the deposition substrate and the encapsulation substrate is usually very small at a distance of 10 μm to 20 μm if the encapsulation substrate is provided in a substrate form as described above.

SUMMARY OF THE INVENTION

It is therefore an object of the present invention to provide an improved organic light emitting display device to solve such drawbacks of the prior art as discussed above.

It is another object of the present invention is to provide an organic light emitting display protecting organic light emitting diodes from external impacts, and a manufacturing method of the same.

One aspect of the present invention is achieved by providing an organic light emitting display device including a first substrate divided into a pixel region and a non-pixel region surrounding the pixel region; a plurality of organic light emitting diode having each pixel formed on the first substrate and provided onto the pixel region; a second substrate for encapsulating the pixel region; and a spacer arranged between the first substrate and the second substrate, provided in at least on region between pixels as a non-light emission region and containing a desiccant.

Another aspect of the present invention is achieved by providing a method of manufacturing an organic light emitting display device, the method including: providing a first substrate that is defined into a pixel region and a non-pixel region surrounding the pixel region; forming a plurality of organic light emitting diodes, which form each pixel, on the first substrate of the pixel region; forming a spacer containing a desiccant in at least one region as a non-light emission region between the pixels; and bonding a second substrate to the first substrate, the second substrate protecting the pixel region.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
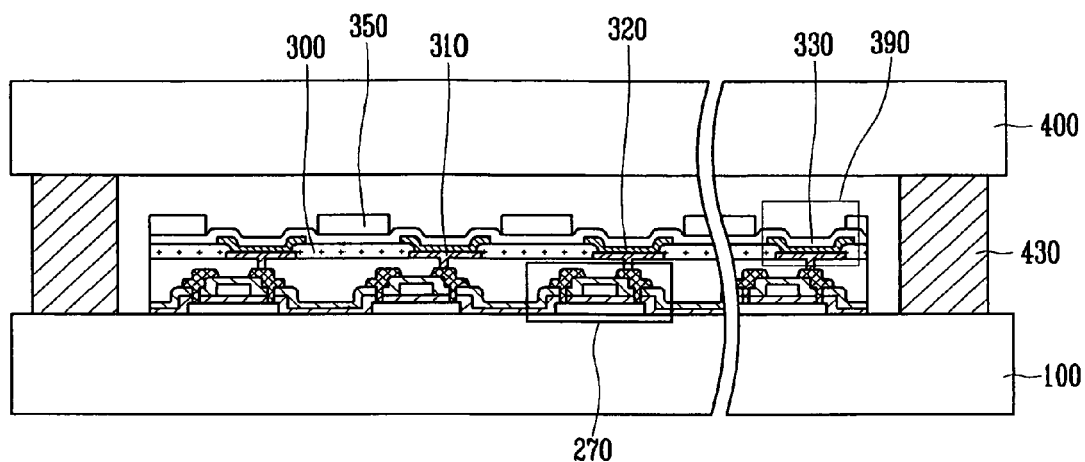
FIG. 1 is a cross-sectional view illustrating an organic light emitting display device according to the first embodiment of the present invention.

Hereinafter, certain exemplary embodiments according to the present invention will be described with reference to the accompanying drawings. Here, when a first element is described as being coupled to a second element, the first element may be not only directly coupled to the second element but may also be indirectly coupled to the second element via a third element. Further, elements that are not essential to the complete understanding of the invention are omitted for clarity. Also, like reference numerals refer to like elements throughout. A light emission region refers to a region where a pixel is formed, and a non-light emission region refers each region between a pixel and another pixel. A pixel region refers to a region including the light emission region and the non-light emission region, and the non-light emission region and a non-pixel region refers to an edge region surrounding a region having pixels.

Figure 2A:
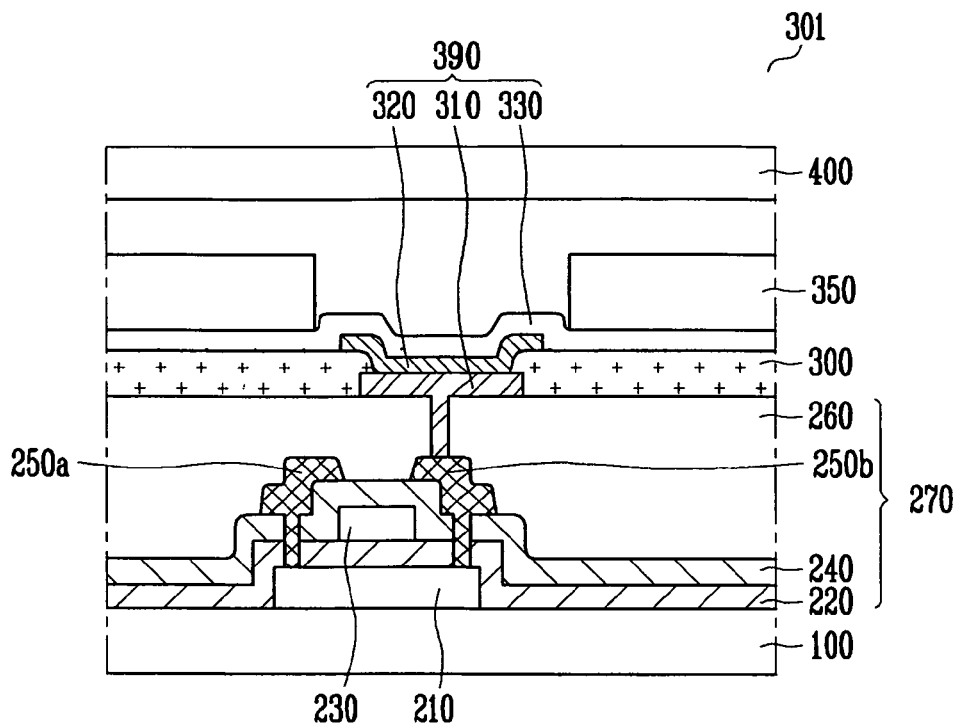
FIG. 2a is an exploded cross-sectional view showing one pixel according to the first embodiment of the present invention.

FIG. 1 is a cross-sectional view showing an organic light emitting display device according to the first embodiment of the present invention, and FIG. 2a is an exploded cross-sectional view showing a pixel 301 according to the first embodiment of the present invention. As shown in FIG. 1 and FIG. 2a, the organic light emitting display device according this embodiment includes a first substrate 100; a thin film transistor array 270 including a plurality of thin film transistors formed on the first substrate 100; a plurality of organic light emitting diodes 390 electrically coupled to the thin 11 film transistors; and a spacer 350 for spacing a second substrate 400 apart from organic light diodes 390, thin film transistors 270 formed on first substrate 100.

First substrate 100 includes a pixel region and a non-pixel region. Here, the pixel region refers to a region that realizes the light emitted from organic light emitting diodes 390 as a predetermined image, and the non-pixel region refers to all the region, other than the pixel region, formed on first substrate 100.

Thin film transistor array 270 is referred to as all layers forming a thin film transistor, and it includes a semiconductor layer 210, a gate electrode 230, a gate insulator 220, an interlayer insulator 240, source/drain electrodes 250a and 250b, and an overcoat 260 in this embodiment, as known in the field of thin film transistor.

Organic light emitting diodes 390 that receive an incoming drive signal include a first electrode 310, an organic thin film layer 320, and a second electrode 330, and organic light emitting diodes 390 are spaced apart from each other as shown in FIG. 1. Here, a position in which first electrode 310 and organic thin film layer 320 of each of organic light emitting diodes 390 are formed is a region assigned by a pixel definition layer 300, and second electrode 330 is formed on top of the above-mentioned organic thin film layer 320 and pixel definition layer 300.

Spacer 350 is provided between first substrate 100 and second substrate 400 to prevent the contact between organic light emitting diode 390 and second substrate 400 when external impacts is applied to spacer 350. Spacer 350 disposed on second electrode 330 is formed on a region corresponding to where organic thin film layers 320 are not formed to intercept the light generated by organic light emitting diodes 390.

Figure 2B:
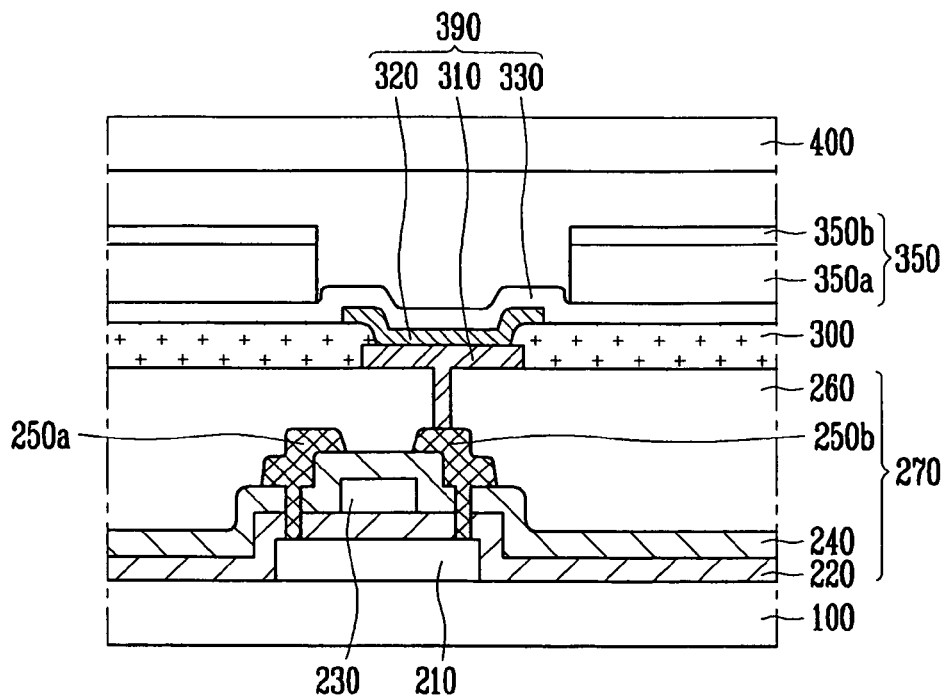
FIG. 2b is a cross-sectional view showing a spacer having a different configuration used in the first embodiment of the present invention.

Spacer 350 may be formed in a configuration including base, or main material composed of acryl or polyimide, wherein the base, or main material of spacer 350 contains a desiccant, or a configuration where a separate desiccant layer 350b is formed on abase, or main material layer 350a of spacer 350 as shown in FIG. 2b.

Spacer 350 containing a desiccant, as described above, has a function to absorb internally penetrated moisture, in addition to spacing second substrate 400 apart from first substrate 100 as basic function of the spacer, and spacer 350 serves to easily manufacture an organic light emitting display device without attaching an extra desiccant.

The desiccant maybe one selected from the group consisting of CaO, MgO and BaO. And, spacer 350 may be formed at a height of 3 μm to 5 μm, and spacer 350 may be in contact with second substrate 400, or spaced apart from second substrate 400, depending on the height of the spacer.

Second substrate 400 for protecting a pixel region is formed on first substrate 100 having organic light emitting diodes formed therein. In this embodiment, glass is mainly used, and an encapsulation substrate using a flat glass is provided herein.

A sealing member 430 is applied onto the circumferential region of second substrate 400 and first substrate 100, and then cured to firmly connect first and second substrate together. Sealing member 430 is a structure in which a space is formed between first substrate 100 and second substrate 400, and, for example sealing member 430 may be formed of inorganic sealing materials such as frit.

Figure 3:
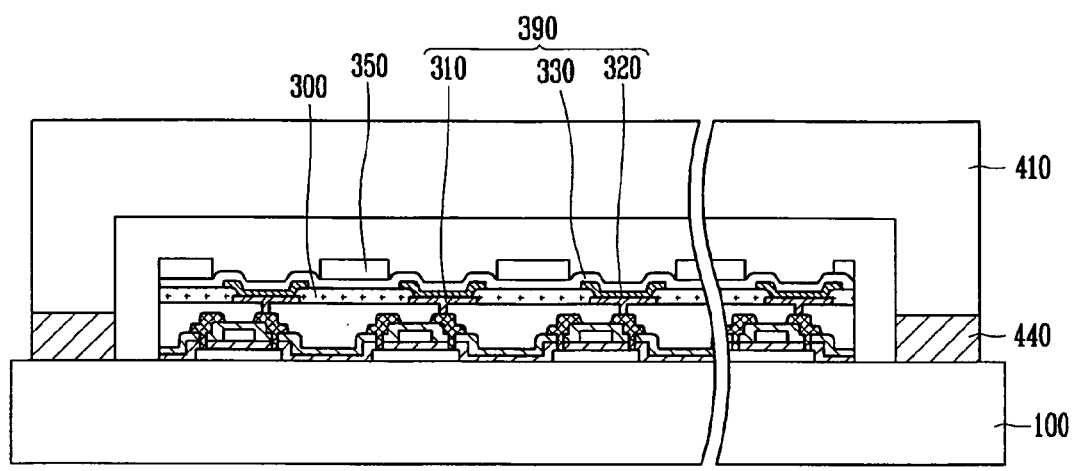
FIG. 3 is a cross-sectional view showing an organic light emitting display device according to the second embodiment of the present invention.

FIG. 3 is a cross-sectional view showing an organic light emitting display device according to the second embodiment of the present invention. In FIG. 3, descriptions of parts that are overlapped with the first embodiment are omitted, but parts that differ from the first embodiment will be described in the following embodiments. Here, the same parts should have the same reference numerals in the following embodiments. In the second embodiment, distinct from the first embodiment, an inside surface of the second substrate is etched. Here, the etched region is an inside surface of the second substrate corresponding to the pixel region in which the pixels are formed. The distance between the pixel region and the second substrate became farther by etching the second substrate, compared to the first embodiment.

Therefore, if such an etching glass is used as the encapsulation substrate, a problem that first substrate 100 and second substrate 410 are in contact with each other when external impacts is applied to the spacer may be rather relieved, compared to the first embodiment. In this case, spacer 350 maybe provided between first substrate 100 and second substrate 410 to prevent the contact of second substrate 410 with the organic light emitting diode. In this case, spacer 350 containing a desiccant has functions to absorb internally penetrated moisture, and spacer 350 serves to easily manufacture an organic light emitting display device without attaching an extra desiccant. Spacer 350 may also have a configuration that a separate desiccant layer is formed on a base, or main material layer composed of acryl or polyimide.

In this case, the employed desiccant maybe one selected from the group consisting of CaO, MgO and BaO. Here, spacer 350 may be formed at a height of 3 μm to 5 μm, and spacer 350 may be in contact with second substrate 400, or spaced apart from second substrate 400, depending on the height of the spacer.

In the case of the second embodiment, a sealing member 440 is applied onto a region where second substrate 410 is in contact with first substrate 100, and then cured.

Figure 4:
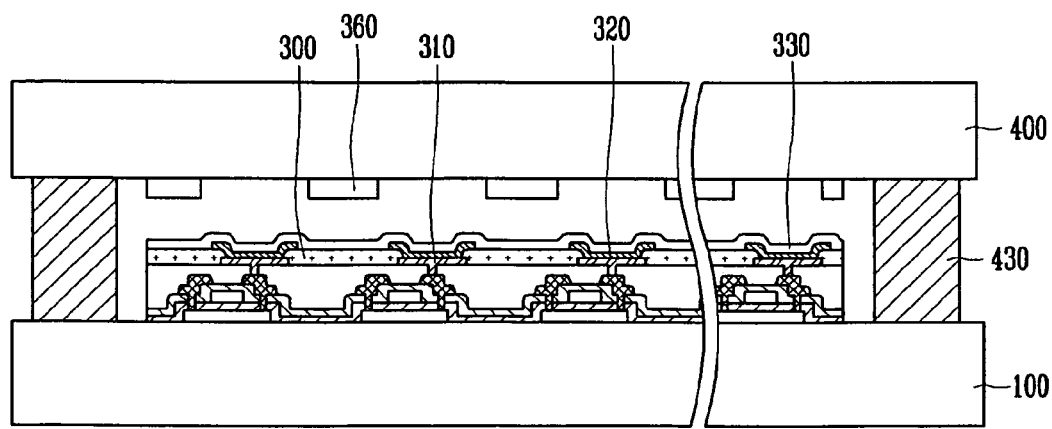
FIG. 4 is a cross-sectional view showing an organic light emitting display device according to the third embodiment of the present invention.

FIG. 4 is a cross-sectional view showing an organic light emitting display device according to the third embodiment of the present invention.

The third embodiment that is distinct from the first embodiment is characterized in that the organic light emitting display device includes a spacer 360 containing a desiccant, wherein spacer 360 is not formed on first substrate 100, but provided in second substrate 400. Spacer 360 may also have a configuration that a separate desiccant layer is formed on a base, or main material layer composed of acryl or polyimide.

That is, spacer 360 is provided in second substrate 400 which is an encapsulation substrate 400, wherein spacer 360 is disposed in a position in which a path of the light emitted from the organic light emitting diodes is not hindered. For example, spacer 360 may be disposed between organic thin film layers 320 formed on first substrate 100.

FIG. 5 to FIG. 8 are cross-sectional views illustrating a method of manufacturing an organic light emitting display device according to the first embodiment of the present invention. A manufacture method used for forming a spacer on a first substrate which is a deposition substrate will be described in details in these embodiments, and it could be understood that to form a spacer on an encapsulation substrate according to the third embodiment will be easily practiced from the following detailed descriptions.

Figure 5:
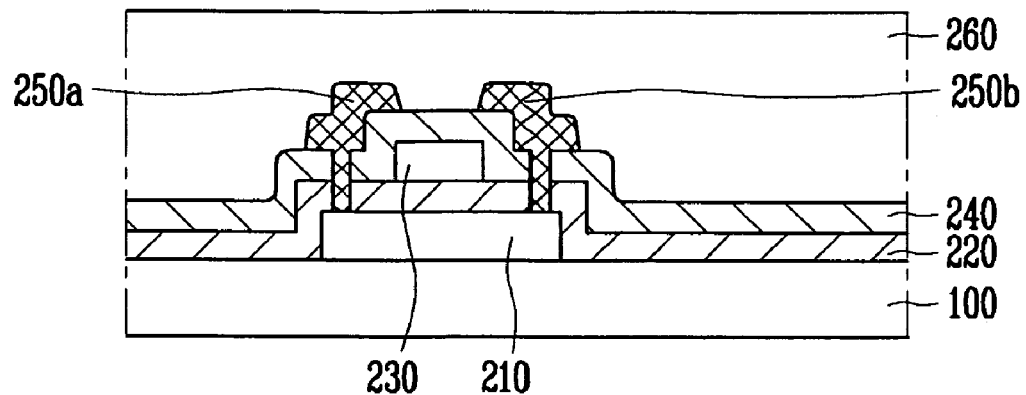
FIG. 5 to FIG. 8 are cross-sectional views illustrating a method of manufacturing an organic light emitting display device according to embodiments of the present invention.

The first step as shown in FIG. 5 is to form a thin film transistor array on first substrate 100. The "thin film transistor array" refers to all layers for forming a thin film transistor, and the thin film transistor array includes a semiconductor layer 210, a gate insulator 220, a gate electrode 230, an interlayer insulator 240, source and drain electrodes 250a, 250b, and an overcoat 260 in this embodiment. In this step, the drawing illustrates a top gate mode thin film transistor, but the formed thin film transistor is not limited thereto, and therefore this step may be not required in the passive drive organic light emitting display devices.

Figure 6:
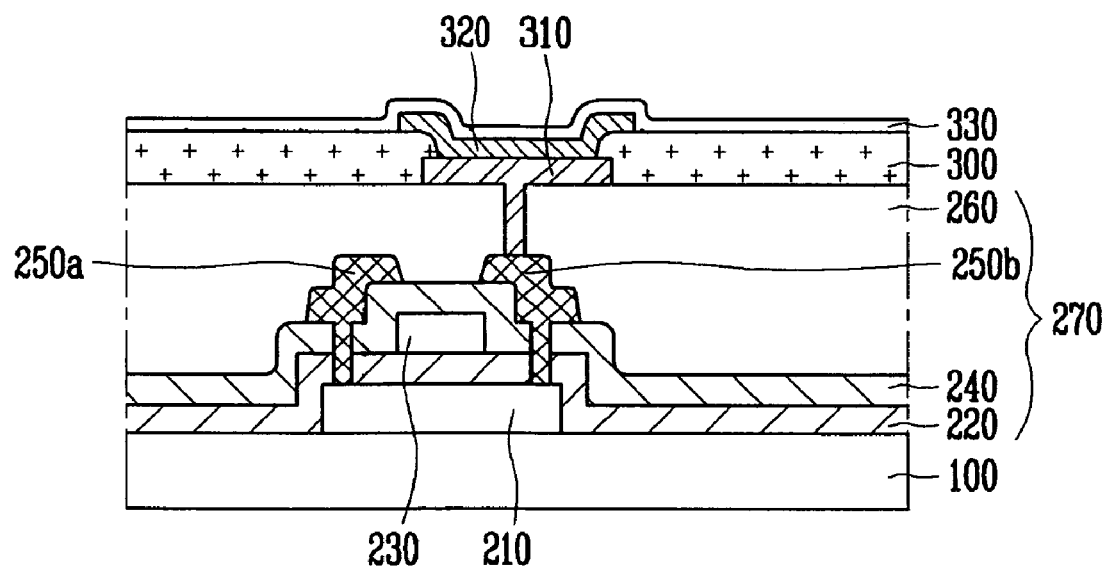

The second step as shown in FIG. 6 is to form a plurality of organic light emitting diodes on the first substrate. The organic light emitting diodes are formed by forming a pixel definition layer on a thin film transistor array 270, followed by sequentially forming a first electrode 310, an organic thin film layer 320 and a second electrode 330 in defined positions.

Figure 7:
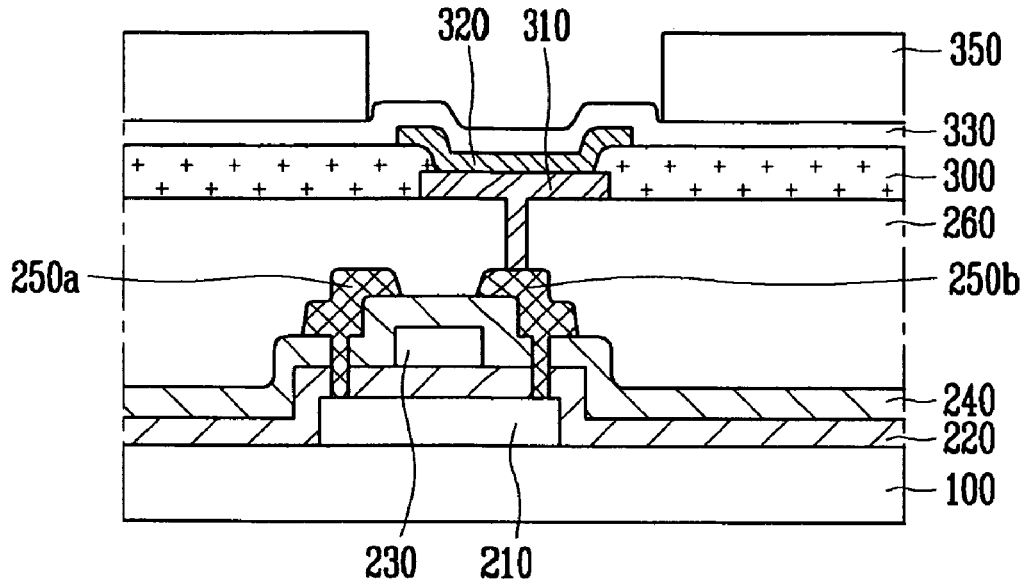

The third step as shown in FIG. 7 is to form a spacer 350 on second electrode 330, spacer 350 containing a desiccant material in a space between organic thin film layers 320. Spacer 350 may be formed by forming a mixture of base materials and a desiccant using a deposition, screen printing or spray method, or forming a desiccant layer on a base material layer.

Figure 8:
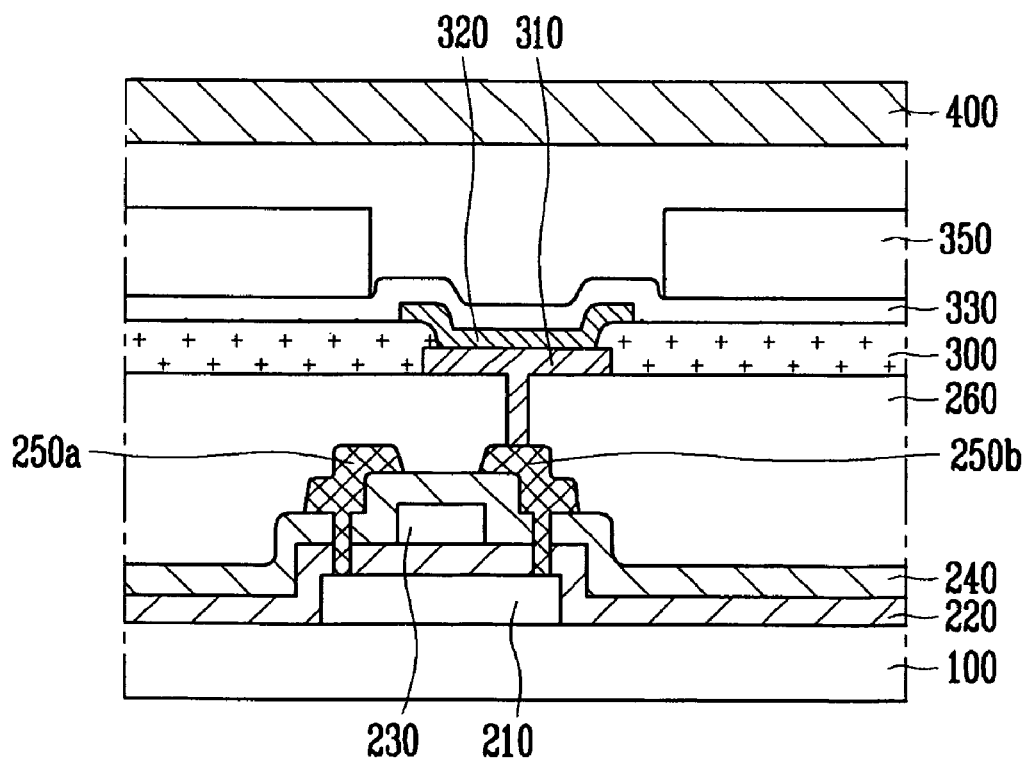

The final step as shown in FIG. 8 is to bond a first substrate 100 having an organic light emitting diode formed therein to a second substrate 400, and to attach first substrate 100 and second substrate 400 by a sealing member 430 (not shown in FIG. 8, but shown in FIG. 1). Second substrate 400 is bonded to first substrate 100 with bound member 430 to cover at least a pixel region of first substrate 100.

The organic light emitting display device according to the present invention may be useful to prevent the organic light emitting diode and the second substrate from being in contact with each other when external impacts is applied to the spacer by forming a spacer between the organic light emitting diodes, the spacer containing a desiccant, thereby to enhance device reliability of the organic light emitting diodes.

Also, the life time of the organic light emitting display device may be extended due to the absorption of moisture by materials having a water absorption properties.

For the manufacturing method used for forming spacer in the second substrate also has four steps. The first step ash shown in FIG. 5, the second step as shown in FIG. 6 and the final step as shown in FIG. 8 are the same as that of the manufacture method used for forming spacers on a first substrate as stated above. In the third step, however, the spacers are disposed in a position in which a path of the light emitted from the organic light emitting diodes is not hindered. For example, the spacers may be disposed between organic thin layers formed on first substrate.

Although exemplary embodiments of the present invention have been shown and described, it would be appreciated by those skilled in the art that changes might be made in these embodiments without departing from the principles and spirit of the invention, the scope of which is defined in the claims and their equivalents.

What is claimed is:

1. An organic light emitting display device, comprising:
a first substrate having a pixel region and a non-pixel region surrounding the pixel region,
a plurality of organic light emitting diodes formed on the first substrate and provided on the pixel region,
a second substrate arranged oppositely and coupled to the first substrate,
a sealing member for coupling the first substrate to the second substrate to encapsulate the pixel region, and
a spacer arranged between the first substrate and the second substrate and provided on a non-light emission region arranged between different neighboring pixels, with one major surface of the spacer being exposed to a space in the non-light emission region disposed between the first and second substrates, the entirety of the spacer being disposed between the second substrate and the uppermost layer disposed on the first substrate, the one major surface of the spacer becoming in physical contact with one of the second substrate and the uppermost layer disposed on the first substrate upon an external impact being applied to the organic light emitting display device.

2. The organic light emitting display device according to claim 1,
wherein the spacer is formed of a single layer which is a mixture of a base, or main material and a desiccant.

3. The organic light emitting display device according to claim 1,
wherein the spacer has a configuration in which a base, or main material layer composed of a base, or main material and a desiccant layer composed of a desiccant are laminated.

4. The organic light emitting display device according to claim 1,
wherein the spacer is formed at a height of from 3 μm to 5 μm.

5. The organic light emitting display device according to claim 1,
wherein the spacer is formed on the first substrate.

6. The organic light emitting display device according to claim 1,
wherein the spacer is formed on the second substrate.

7. The organic light emitting display device according to claim 3,
wherein the base, or main material of the spacer is acryl or polyimide.

8. The organic light emitting display device according to claim 2,
wherein the desiccant is one selected from the group consisting of CaO, MgO and BaO.

9. The organic light emitting display device according to claim 1,
wherein the organic light emitting diodes have a configuration in which a first electrode, an organic thin film layer and a second electrode are sequentially laminated, and the spacer is provided on the second electrode.

10. The organic light emitting display device according to claim 1, with the second substrate being etched to correspond to the pixel region.

11. A method of manufacturing an organic light emitting display device, comprising:
providing a first substrate that is defined into a pixel region and a non-pixel region surrounding the pixel region;
forming a plurality of organic light emitting diodes, which form a pixel, on the first substrate of the pixel region;
forming a spacer containing a desiccant, the spacer arranged between the first substrate and the second substrate and provided, on a non-light emission region arranged between different neighboring pixels, with one major surface of the spacer being exposed to a space in the non-light emission region disposed between the first and second substrates, the entirety of the spacer being disposed between the second substrate and the uppermost layer disposed on the first substrate, the one major surface of the spacer becoming in physical contact with one of the second substrate and the uppermost layer disposed on the first substrate upon an external impact being applied to the organic light emitting display device; and bonding a second substrate to the first substrate by a sealing member, the second substrate protecting at least one pixel region of the first substrate.

12. The method of manufacturing an organic light emitting display device according to claim 11, wherein the spacer containing a desiccant is formed by using one of deposition, screen printing and spray methods.

13. The method of manufacturing an organic light emitting display device according to claim 11, further comprised of forming the spacers on the second substrate.

14. The method of manufacturing an organic light emitting display device according to claim 11, further comprised of forming the spacers on a pixel definition layer.

* * * * *